(12) United States Patent
Aitzetmueller et al.

(10) Patent No.: US 10,624,243 B2
(45) Date of Patent: Apr. 14, 2020

(54) INVERTER FOR CONVERTING A DC VOLTAGE INTO AN AC VOLTAGE

(71) Applicant: Fronius International GmbH, Pettenbach (AT)

(72) Inventors: David Aitzetmueller, Scharnstein (AT); Franz Windischbauer, Weisskirchen (AT); Bernhard Artelsmair, Pettenbach (AT); Guenter Achleitner, Sattledt (AT); Ronald Leitgeb, St. Salvator (AT)

(73) Assignee: Fronius International GmbH, Pettenbach (AT)

( * ) Notice: Subject to any disclaimer, the term of this patent is extended or adjusted under 35 U.S.C. 154(b) by 142 days.

(21) Appl. No.: 15/759,277

(22) PCT Filed: Sep. 13, 2016

(86) PCT No.: PCT/EP2016/071478
§ 371 (c)(1),
(2) Date: Mar. 12, 2018

(87) PCT Pub. No.: WO2017/046041
PCT Pub. Date: Mar. 23, 2017

(65) Prior Publication Data
US 2018/0184542 A1   Jun. 28, 2018

(30) Foreign Application Priority Data

Sep. 14, 2015 (EP) .................................... 15185033

(51) Int. Cl.
*H05K 7/20* (2006.01)
*H02S 40/34* (2014.01)
(Continued)

(52) U.S. Cl.
CPC ............ *H05K 7/209* (2013.01); *H02M 7/003* (2013.01); *H02S 40/345* (2014.12);
(Continued)

(58) Field of Classification Search
CPC .. H02J 13/0003; H02J 7/0044; H05K 5/0086; H05K 5/0247; H05K 7/1427;
(Continued)

(56) References Cited

U.S. PATENT DOCUMENTS 8,520,381 B2  8/2013 Hobein et al.
2011/0222244 A1  9/2011 Takashiro et al.
(Continued)

FOREIGN PATENT DOCUMENTS

CN   202488372 U   10/2012
CN   203352457 U   12/2013
(Continued)

OTHER PUBLICATIONS

International Search Report of PCT/EP2016/071478, dated Dec. 8, 2016.
(Continued)

*Primary Examiner* — James Wu
*Assistant Examiner* — Michael A Matey
(74) *Attorney, Agent, or Firm* — Collard & Roe, P.C.

(57) ABSTRACT

An inverter for converting DC voltage into AC voltage, in particular a photovoltaic inverter for high power densities, in particular 250 W/dm$^3$ to 500 W/dm$^3$ power densities, has at least one DC input, an AC output, a heat sink, a printed circuit board, a DC disconnector, a DC-DC converter, an intermediate circuit, a DC-AC converter and a housing with a front cover and a basic shell. The electrical components of the DC-DC converter, intermediate circuit and DC-AC converter are combined into subassemblies. At least the DC disconnector and the subassemblies of the DC-DC con- (Continued)

verter, intermediate circuit and DC-AC converter are directly arranged on the circuit board in a U-shaped manner corresponding to the energy flow direction from DC input to AC output. The circuit board is arranged with the component side facing the base (65) of the basic housing shell and with the opposite side on the heat sink.

20 Claims, 6 Drawing Sheets

(51) Int. Cl.
 *H05K 7/14* (2006.01)
 *H02M 7/00* (2006.01)
 *H02M 1/00* (2006.01)
(52) U.S. Cl.
 CPC ....... *H05K 7/1432* (2013.01); *H05K 7/20918* (2013.01); *H02M 2001/007* (2013.01)
(58) Field of Classification Search
 CPC .. H05K 7/209; H05K 7/1432; H05K 7/20918; H01M 2010/4271; H01M 2010/4278; H02S 40/345; H02M 7/003; H02M 2001/007
 See application file for complete search history.

(56) References Cited

U.S. PATENT DOCUMENTS

| | | | |
|---|---|---|---|
| 2012/0033392 A1* | 2/2012 | Golubovic | H02S 40/34 361/752 |
| 2014/0247554 A1* | 9/2014 | Sharma | H05K 7/1432 361/695 |
| 2015/0138729 A1 | 5/2015 | Desai et al. | |
| 2015/0245535 A1 | 8/2015 | Fujita et al. | |

FOREIGN PATENT DOCUMENTS

| | | |
|---|---|---|
| EP | 2 299 582 A1 | 3/2011 |
| EP | 2 367 276 A2 | 9/2011 |
| EP | 2 456 294 A2 | 5/2012 |
| EP | 2 611 273 A2 | 7/2013 |
| EP | 2 675 054 A1 | 12/2013 |

OTHER PUBLICATIONS

European Office Action in EP 15185033.6-1803, dated Mar. 16, 2016, with English translation of relevant parts.
Chinese Office Action in Chinese Application No. 201680052911.6, dated Mar. 20, 2019, with English translation.

* cited by examiner

INVERTER FOR CONVERTING A DC VOLTAGE INTO AN AC VOLTAGE

CROSS REFERENCE TO RELATED APPLICATIONS

This application is the National Stage of PCT/EP2016/071478 filed on Sep. 13, 2016, which claims priority under 35 U.S.C. § 119 of European Application No. 15185033.6 filed on Sep. 14, 2015, the disclosure of which is incorporated by reference. The international application under PCT article 21(2) was not published in English.

The invention relates to an inverter for converting a DC voltage into an AC voltage, in particular a photovoltaic inverter for high power densities, in particular power densities of 250 W/dm$^3$ to 500 W/dm$^3$, having at least one DC input, an AC output, a heat sink, a printed circuit board, a DC disconnector, a DC-DC converter, an intermediate circuit, a DC-AC converter and a housing with a front cover and a basic shell.

From EP 2 299 582 A1 an inverter for converting a DC voltage into an AC voltage is known. The inverter comprises a housing, in which electrical components are arranged. These electrical components for forming the components necessary in an inverter, such as DC-DC converter, intermediate circuit and DC-AC converter are partially arranged on a printed circuit board, partially in recesses on both sides of the cooling air channel and partially directly on the heat sink which is designed as outer wall of the housing. In addition, a DC disconnector for securely disconnecting the inverter from a DC source is arranged on another modular unit. The relatively complex manufacture and maintenance of this inverter constitutes a disadvantage.

The EP 2 611 273 A2 describes an inverter, whose components are divided into regions and are arranged such that a wall assembly of the inverter is supported.

EP 2 367 276 A2 shows an inverter that is built up in modules in regions of its own for the possibility of simple maintenance and optimum cooling of the heat producing components.

Thus, the invention is based on the object to simplify, starting from the above described prior art, the structure of the inverter, whereby a compact structure is to be achieved.

The invention solves the problem posed in that the electrical components of the DC-DC converter, intermediate circuit and DC-AC converter are combined into subassemblies, and at least the DC disconnector as well the subassemblies of the DC-DC converter, intermediate circuit and DC-AC converter are arranged directly on the printed circuit board in a U-shaped manner corresponding to the energy flow from the DC input to the AC output, and the printed circuit board is arranged on the heat sink with the side opposite the component side, facing with its component side in the direction of the base of the basic shell of the housing. By combining the electrical components for the DC-DC converter, intermediate circuit and DC-AC converter into subassemblies and by corresponding arrangement directly on the printed circuit board the structure of the inverter may be simplified considerably and a compact construction can be achieved. The arrangement of all electrical components on a printed circuit board may not only favour the simple mechanical structure of the inverter but also considerably increase its maintainability. Thus, in the event of an error, the entire printed circuit board may be exchanged quickly, with only the terminal connections to the DC input or the AC output, respectively having to be separated, and the operational capability of the inverter can be restored in a minimum of time. Therefore, any expensive and time-consuming troubleshooting as to which component is concerned may be avoided in the installed plant on-site.

Further, due to the U-shaped arrangement of the subassemblies from the DC input to the AC output the subassemblies may, on the one hand, be connected by means of short lines and, on the other hand, also the DC input and the AC output may be arranged on one side, that is the connection side. The arrangement of the printed circuit board with the component side facing in the direction of the base of the basic shell of the housing and with the side opposite the component side on the heat sink also facilitates the assembly and maintenance of the inverter. The compact structure of the inverter according to the invention is of particular advantage in the case of inverters for high power densities of 250 W/dm$^3$ to 500 W/dm$^3$. Due to the fact that the printed circuit board is arranged with the side opposite the component side on the heat sink, an advantageous cooling of the printed circuit board and thus the electrical components can be achieved. Furthermore, the time and effort spend for service and repair on site may be reduced, if the printed circuit board is available together with the heat sink as an exchange element. In general, it is to be stated that depending on size and use of the inverter also a structure comprising several DC inputs and DC-DC converters is conceivable. In the case of multi-phase, in particular 3-phase inverters with 3-phase AC outputs, the concept according to the invention may be applied in an especially advantageous manner. This may prove advantageous especially in connection with solar modules, since thus the solar modules or strings of solar modules may be operated separately in different operating points. These operating points usually correspond to the maximum power points (MPPs) of the individual solar modules or strings of solar modules. Also a simultaneous or alternating energy supply of different energy sources, such as batteries and solar modules may be realized by such a structure. Several different outputs for the inverter are likewise conceivable. Thus, for example, an additional output for loads with increased reliability of supply, which are preferably supplied with energy with low supply power at the DC inputs may be provided.

If the printed circuit board is inclined relative to the base of the basic shell of the housing, i.e. preferably arranged at an angle of a maximum of 15°, this may result in advantages in the assembly and the operation of the inverter, since thus due to the inclination of the printed circuit board on one side, in particular in the connection region, more space may be made available for the connection of e.g. solar modules.

Other advantages may be achieved, if a control unit is provided, which control unit is arranged centrally on the printed circuit. In this connection, the control unit may be arranged in the middle of the U-shaped arrangement of the other subassemblies, thus resulting in short connections to the other subassemblies. If solar modules are used for producing and supplying energy, the control unit may additionally form one or several optional MPP (maximum power point) trackers. The control unit changes the impedance of the DC-DC converter and therefore the operating point of the solar modules may be adjusted. Thus a simplified, compact structure may also be achieved in a functionally fully developed photovoltaic inverter.

If the inverter comprises at least one EMV filter, in particular a DC input EMV filter and/or an AC output EMV filter, which at least one EMV filter is directly arranged on the printed circuit board, EMV filters connected upstream or downstream may be dispensed with and nevertheless the prerequisites with respect to electromagnetic compatibility may be fulfilled. In addition, by arranging the EMV filters directly on the printed circuit board, additional electric components, such as the above mentioned upstream or downstream EMV filters become obsolete, thus creating an inverter, whose entire electrical components, including the control unit, are arranged on a printed circuit board. This has advantages in terms of compactness, mechanical and electrical structure as well as maintenance of the inverter.

The arrangement of the subassemblies for DC-DC converter, intermediate circuit and DC-AC converter on a printed circuit board may be favoured, if the DC-DC converter and the DC-AC converter are designed for switching frequencies of more than 30 kHz, in particular switching frequencies larger or equal 100 kHz. These higher switching frequencies may be used by minimizing the losses, for example by means of zero voltage switching topology or active switch balancing, and allow the use of smaller inductors and chokes, which simplifies the assembly thereof on the printed circuit board and favours the structure of inverters with high power densities, in particular power densities of up to 500 W/dm$^3$.

The structure of the inverter may be further simplified, if a recess for an actuating element of the DC disconnector and an air inlet are arranged in the front cover, and an actuating shaft of the DC disconnector is passed preferably through openings on the printed circuit board and heat sink to the front cover. Then, accessibility to the inverter may be necessary only from the housing front side, which may be of advantage for different mounting variants, such as wall or ceiling mounts. Given that the actuating shaft of the DC disconnector is preferably implemented through openings on the printed circuit board and heat sink to the front cover, the actuating element of the DC disconnector may be arranged on the front cover and the DC disconnector in the second, inner housing chamber may be arranged directly on the printed circuit board. Actuation of the DC disconnector from outside may thus be easily performed, whereby nevertheless a simple and compact structure of the inverter according to the invention can be achieved.

If on the narrow side of the housing, in particular on all narrow sides of the housing, between the front cover and the basic shell, in particular slit-shaped openings are provided for the air outlet, the warm exhaust air of the inverter can be distributed uniformly. Especially when several inverters are arranged next to one another, the uniform lateral distribution of the exhaust air may be advantageous, since the inverters located next to one another do not heat each other via its entire warm exhaust air stream. This may become evident in particular if the air inlet is arranged in the front cover, since thus warm exhaust air of a neighbouring device is not sucked or only slightly.

The heat sink is preferably located at least partially on the front cover of the housing, whereby vibration of the front cover due to the sucked-in cooling air flow or induced by the oscillations caused by the electrical components or the fan motor can be prevented.

If the heat sink is adjacent at least partially on the sidewalls of the basic shell of the housing and the heat sink forms a stiffening element for the housing, the stability of the assembled inverter may be improved by the heat sink, which allows a simpler and cheaper housing construction. In particular, the basic shell of the housing may benefit from stiffening by means of the heat sink.

The heat sink divides the housing into at least two housing chambers, with a sealing being preferably arranged between the heat sink and the basic shell. Thereby the first, outer housing chamber may receive the cooling air from outside of the housing, cool the heat sink and again release the cooling air to the outside. In addition, the heat sink in the first, outer housing chamber is shaded by the front cover, which may be of advantage in particular when installing the inverter outdoors. Heating the interior by solar radiation may thus be reduced efficiently. However, the second, inner housing chamber does not come into contact with the cooling air from outside the housing and can be protected from impurities such as dust. By arranging the electrical components in the second, inner housing chamber, the life as well as the maintenance intervals of the inverter may be increased, since the sensitive electrical components are protected from impurities and dust, which is improved, in particular, by the preferably arranged sealing.

If the longitudinal section of the basic shell of the housing is formed essentially with a trapezoidal shape, with the two sidewalls of the basic shell being in parallel to one another and one sidewall being formed to be lower than the other sidewall, in the case of the higher sidewall a higher region of the basic shell will result, which causes an improvement of the convection of the cooling air and on the whole a better cooling of the inverter. If a sealing is arranged between the heat sink and the basic shell, in the case of the basic shell having a trapezoidal longitudinal section a plane sealing contour may result, which permits simple and inexpensive manufacture of the sealing. Due to the fact that the printed circuit board is arranged with its component side in the direction of the base of the basic shell and subsequently to the higher sidewall of the basic shell, also higher components may be placed in the region of the higher sidewall. Since the higher components may often also have a higher heat output due to the higher volume, this arrangement may additionally contribute to cooling the inverter in the edge region. Especially when the inverter is mounted to the wall, this higher side wall may be arranged on top. The associated arrangement of the warmer components above the cooler components may have a favourable effect on the cooling of the entire system. On the other hand, due to the arrangement of the printed circuit board with its component side in the direction of the base of the basic shell, the DC inputs and AC outputs are arranged at a distance from the base of the basic shell, which can facilitate access to the DC inputs and AC outputs. In particular if the printed circuit board extends in parallel to the heat sink and the basic shell as well as the heat sink are adapted with a trapezoidal longitudinal section, a height difference in the connection region may be achieved. Operation or maintainability, respectively of the inverter may thus be improved, whereby nevertheless a sealing having a simple sealing contour may be used without any height differences.

This may be improved once more, when a connection region for connecting DC sources to the DC input and for connecting a load or the like to the AC output is subsequently adapted to the low sidewall of the basic shell. Thus, in this region of the low sidewall a simpler access to the input and output may be achieved, since due to its lower height the sidewall is not a hindrance in operation and maintenance works.

Air conducting elements may be arranged within the housing, to specifically guide the airflow through the housing. Thus, cooling of the heat dissipating components may take place in an especially effective manner.

A sufficient electromagnetic shielding may be achieved, if shielding plates for cage-like enclosing of the printed circuit board including the subassemblies arranged thereon are provided, and preferably the heat sink partially forms part of the shielding plates. The Faraday cage adapted by the shielding plates may cause an especially effective shielding of electromagnetic waves and allow for compliance of predetermined EMV threshold values. The fact that the heat sink partially forms the shielding plates, simplifies the structure of the electromagnetic shielding. Since the conductive heat sink may take on the task of shielding, in addition to the task of cooling, this double function may be given with only one element, that is the heat sink on the side of the printed circuit board facing towards the heat sink.

The electromagnetic shielding may be improved, if individual subassemblies, in particular EMV filters, are shielded against other subassemblies with shielding plates. A separate shielding of subassemblies against other subassemblies, in particular the EMV filters can prevent the build-up and transfer of radiation emissions of the individual subassemblies to other subassemblies, whereby threshold values permitted for the radiation emission may be observed.

The functionality of the inverter may be broadened, if the inverter comprises a communication unit, which communication unit is arranged directly on the printed circuit board. In particular, the communication unit can be formed by a so-called power-line communication unit. The direct arrangement on the printed circuit board assists the compact structure of the inverter. Depending on the arrangement of the communication unit information may be exchanged with upstream or downstream components of the energy system, such as batteries, solar modules and/or smart meters.

For example, in a photovoltaic inverter for converting the DC voltage of strings of solar modules, the communication unit for the communication with the module electronics may be formed on the solar modules. Thus, information may be made accessible to the inverter on the module level. In addition, a security element is arranged on the module side, a so-called rapid shutdown box may serve to communicate, to be able to shut off the energy supply in the case of an error directly in the solar modules.

If the DC-AC converter and/or the DC-DC converter is adapted for a bidirectional energy flow, energy may both be delivered to the load(s) and may be received, in order to charge existing energy stores, for example batteries. Such an inverter may both store energy in the energy stores provided for this and remove energy, and for this reason may also be used for temporary emergency power supply. Depending on the respective energy store its connection may take place on the DC inputs, but also on the intermediate circuit.

The present invention will be described in more detail below with reference to the enclosed drawings, which show advantageous embodiments of the invention in an exemplary, schematic and non-limiting manner, in which.

Figure 1:
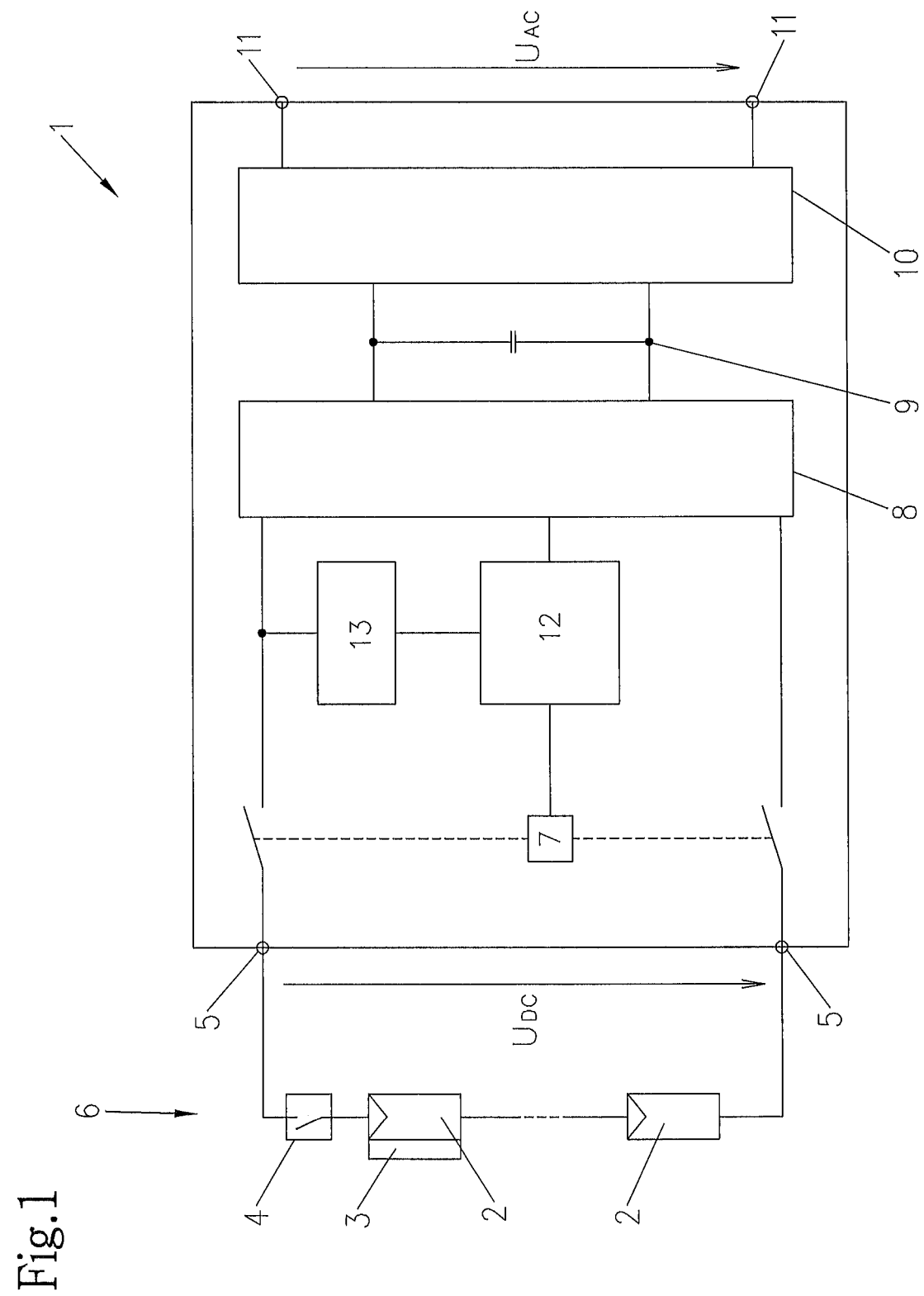
FIG. 1 shows a block diagram of an exemplary inverter.

FIG. 1 shows the block diagram of an exemplary inverter 1, in particular a photovoltaic inverter for converting a DC voltage $U_{DC}$ into an AC voltage $U_{AC}$. In this embodiment, the DC voltage $U_{DC}$ is produced by the solar modules 2 of the photovoltaic plant. In this connection, some solar modules 2 are equipped with a module electronics 3, and the so-called rapid shutdown box 4 may be arranged close to the energy producing solar modules 2. The rapid shutdown box 4 is a security precaution in the event of an error, to be able to interrupt the current flow also close to the solar modules 2. Supplying the DC voltage $U_{DC}$ into the inverter 1 takes place via DC input 5. It is common that several solar modules 2 are interconnected to strings 6 in a photovoltaic plant, wherein several strings 6 are connected in parallel to a DC input 5. The inverter 1 is normally equipped with several DC inputs 5, of which for reasons of convenience only one DC input 5 is shown in the block diagram. A DC disconnector 7 is arranged downstream of said DC input 5 or DC inputs in order to be able to interrupt the energy supply to the inverter 1. The DC voltage $U_{DC}$ is converted via DC-DC converter 8, intermediate circuit 9 and the DC-AC converter 10, and the electric power is forwarded in the form of an AC voltage $U_{AC}$ to an AC output 11. The conversion of the DC voltage $U_{DC}$ into the AC voltage $U_{AC}$ takes place under the control of a control unit 12, which adjusts the latest operating parameters by means of measured values and settings not illustrated in more detail. In addition, the control unit 12 has access to a communication unit 13, for example a power-line communication unit, to exchange data with the components far from the inverter, for example the module electronics 3 of solar modules 2.

Figure 2:
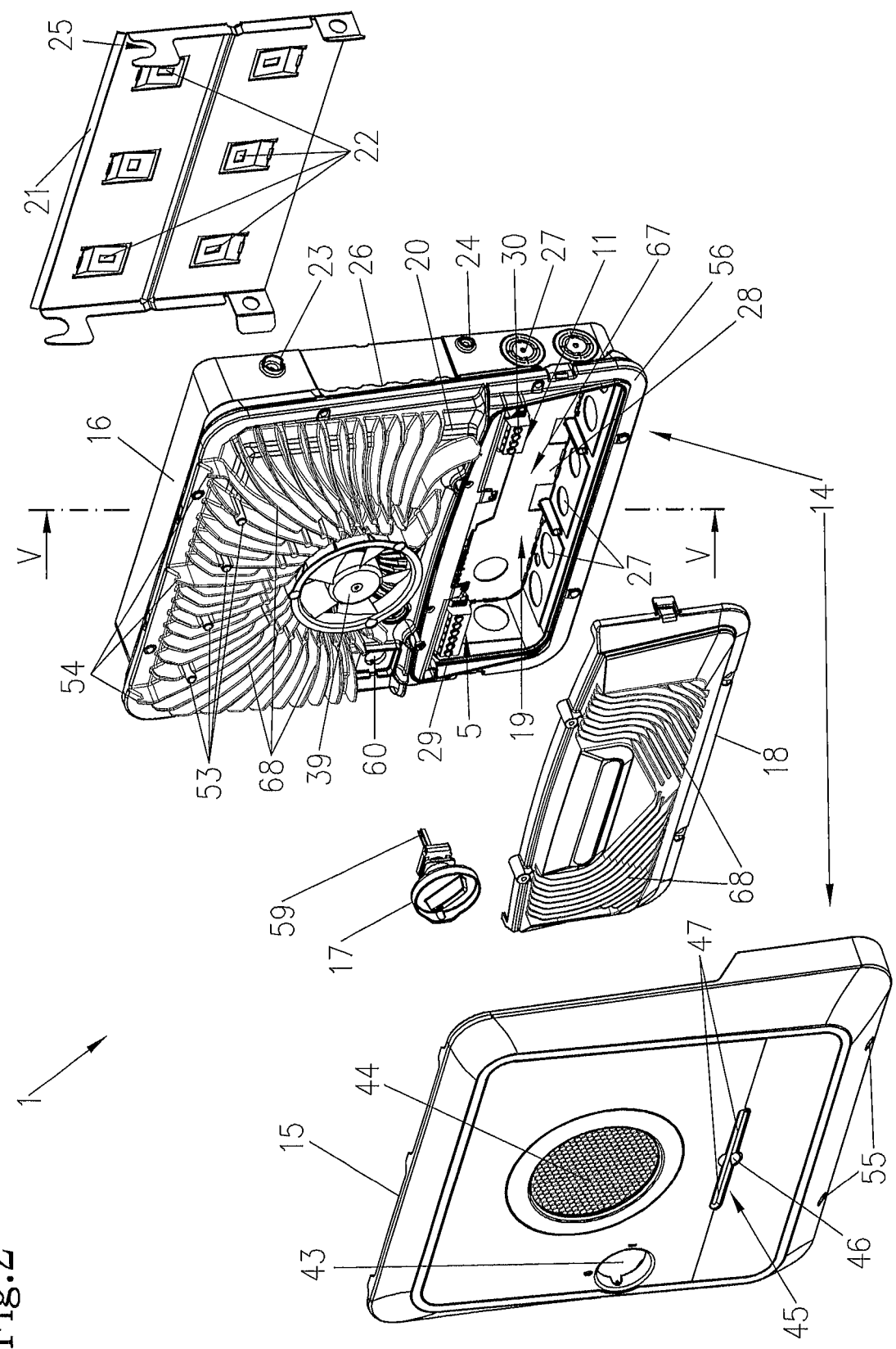
FIG. 2 shows an exploded view of an inverter.

Usually the above-mentioned components of the inverter 1 are built into a housing 14, whose enclosing elements are the front cover 15 and the basic shell 16, such as is shown in the exploded drawing in an exemplified embodiment in FIG. 2. Seen from left to right, this Fig. shows front cover 15, actuating element 17 for DC disconnector 7, cover 18, connection region 19, heat sink 20 mounted on the basic shell 16 and wall mount 21. The wall mount 21 comprises several holes 22 for its fixture. For fixing the basic shell 16 or the assembled inverter 1 to the wall mount 21, two holding points 23, 24 are provided each on both sides of the basic shell. The upper holding points 23 may be passed into the corresponding recesses 25 of the wall mount 21 and, by a subsequent pivot movement, the lower holding points 24 may be caused to latch in the wall mount 21. Furthermore, the basic shell 16 has recessed handles 26 at both sides between the holding points 23, 24 for the wall mount 21. This permits an easy-to-handle, tool-free mounting of the inverter 1 to the wall mount 21, whereby a stable connection is obtained despite the fact that no screws are used. In the lower part of the basic shell 16, which is not covered by the heat sink 20, one can see the connection region 19. In this area, several connection openings 27 that can be broken are arranged in the basic shell 16. Furthermore, a metallic insert 28 can be seen in the interior of the connection region 19. Said insert 28 is to be connected to ground when connecting the inverter 1 and then constitutes the protective grounding for the entire connection region 19. The connection terminals 29, 30 of the DC input 5 and AC output 11 can be seen in the upper connection region 19.

Figure 3:
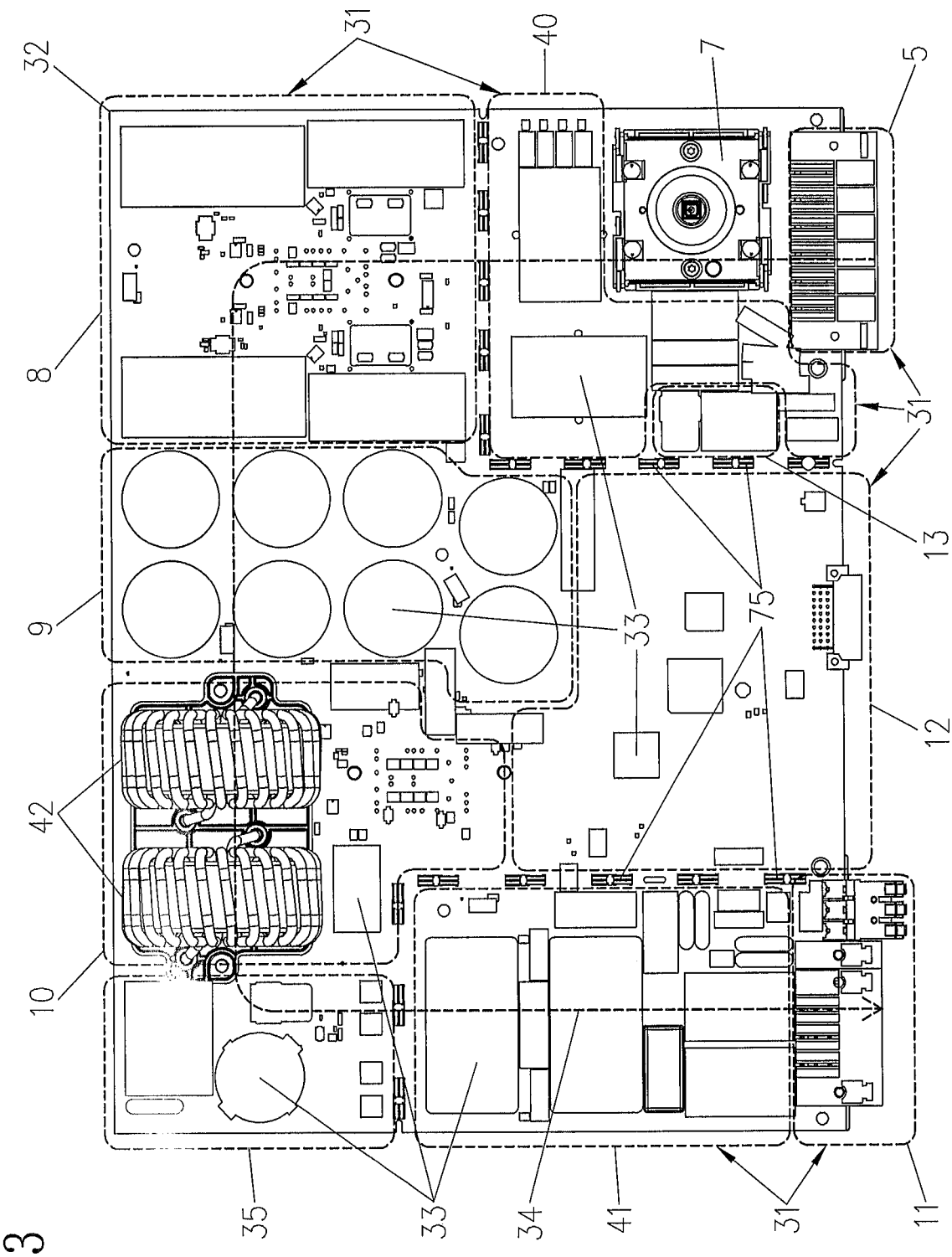
FIG. 3 shows a top view of the printed circuit board of the inverter.

The connection terminals 29, 30 are of the plug-in type and establish the connection to the printed circuit board 32 (see FIG. 3). In the shown inverter 1 it is arranged in the basic shell 16. According to the invention, the electrical components 33 for DC-DC converter 8, intermediate circuit 9 and DC-AC converter 10 are combined into subassemblies 31 on the printed circuit board 32. Here, the DC disconnector 7 as well as the subassemblies 31 for the DC-DC converter 8, intermediate circuit 9 and DC-AC converter 10 are directly arranged on the printed circuit board 32 in a U-shaped manner corresponding to the energy flow direction 34 from the DC input 5 to the AC output 11. For mounting the DC disconnector 7 on the printed circuit board 32, a special variant of a DC disconnector 7 with soldered connections is used. Accordingly, the DC disconnector 7 in the energy flow direction is subsequently mounted to the DC input 5 on the printed circuit board 32. In addition to the above-mentioned subassemblies 32, in the shown exemplary embodiment a so-called residual current monitoring unit 35 is arranged on the printed circuit board 32 to monitor the sum currents. By jointly arranging the components 33 on a printed circuit board 32 the structure of the inverter 1 is considerably simplified. On the one hand, this optimizes the manufacturing process better, for example by means of flow soldering of all high current connections, with the simultaneous absence of trouble-prone cable connections. On the other hand, this will also result in an improved maintainability and easier repairs, since in the case of an error the entire printed circuit board 32 may be exchanged. For this purpose, all that needs to be done is to unplug the plug-type connection terminals 29, 32 to the DC input 5 or the AC output 11 respectively, exchange a printed circuit board 32 and re-plug them. The U-shaped arrangement of the subassemblies 31 from the DC input 5 to the AC output 11 is also advantageous, since thus only short connections between the subassemblies 31 are necessary, however, on the other side also the DC input 5 and out AC output 11 are arranged on the lateral edge portion of the printed circuit board 32, that is the edge portion facing the connection region 19. Thus, the operational capability of the inverter 1 is restored in a minimum of time. An expensive and time-consuming troubleshooting as to which subassemblies 31 or components 33 are effected does not have to be performed in the installed plant on-site.

In addition, as may be seen in FIG. 2, the heat sink 20 is arranged with its main extension plane 36 essentially in parallel between the front cover 15 and the basic shell 16. Thus, the heat sink 20 subdivides the housing 14 into two chambers 37, 38 (cf. FIG. 5) and at the same time improves its mechanical stability. The fan 39 is arranged on the front face of the device between the front cover 15 and the heat sink 20, with the direction of air perpendicular to the heat sink 20. In the shown exemplary embodiment, the fan 39 is arranged centrally on the heat sink 20 and recessed into a recess of the heat sink 20. However, the use of a considerably larger fan 39 having a diameter of approximately the housing width would also be conceivable, without having a relevant influence on the housing depth. A compact inverter 1 having a simple design, which can also be used for high power densities from 250 W/dm$^3$ to 500 W/dm$^3$, can be realized, as is shown in the exemplary embodiment.

FIG. 3 further shows that the control unit 12 of the inverter 1 is arranged centrally on the printed circuit board 32, that is in the middle of the U-shaped arrangement of the other subassemblies 31. The result will be short connections to each one of the other subassemblies 31. In addition, the control unit 12 takes on the function of the MPP tracker for the solar modules 2. Thus, also in a functionally fully developed inverter 1 for solar modules 2, a simplified compact structure can be obtained.

The DC input EMV filter 40 and the AC output EMV filter 41 are also directly arranged on the printed circuit board 32. Upstream or downstream EMV filters become obsolete thereby and the prerequisites concerning the electromagnetic compatibility may be complied with nevertheless. Thus, on the inverter 1 all electrical components are arranged on one printed circuit board 32 only, which simplifies the mechanical and electrical structure and thus improves the manageability and lose of servicing: The connection to DC input 5 and AC output 11 takes place via plugs, so as to be able to perform a fast and easy-to-handle connection despite the compact structure. An inverter 1 according to the invention, whose entire electrical components 33 including the control unit are arranged on one printed circuit board 32, offers considerable advantages with respect to compactness, mechanical and electrical structure as well as maintainability.

Since both the DC-DC converter 8 and the DC-AC converter 10 are preferably designed for switching frequencies above 30 kHz and more, a simplified arrangement of the subassemblies 31 for the DC-DC converter 8, intermediate circuit 9 and DC-AC converter 10 on only one printed circuit board 32 is made possible. These higher switching frequencies are achieved by using the zero voltage switching or by an active switch balancing. This minimizes the switching losses, which is necessary to enable the economical use of high switching frequencies. Due to these very higher switching frequencies the use of smaller dimensional conductors and chokes 42 is made possible, which facilitates the mounting on the printed circuit board 32, since the additional mechanical mounting of these components 33 can be omitted.

As is shown in FIG. 2, a recess 43 for an actuating element 17 of the DC disconnector 7 and an air inlet 44 are arranged in the front cover 15. In addition, a display and operating element 45 with a capacitive sensor 46 and LEDs 47 is arranged below the air inlet 44. For this reason, in operation, it is necessary that the inverter 1 is accessible only from the front side of the housing, which makes the inverter 1 suitable for both wall and ceiling mounting.

Figure 4:
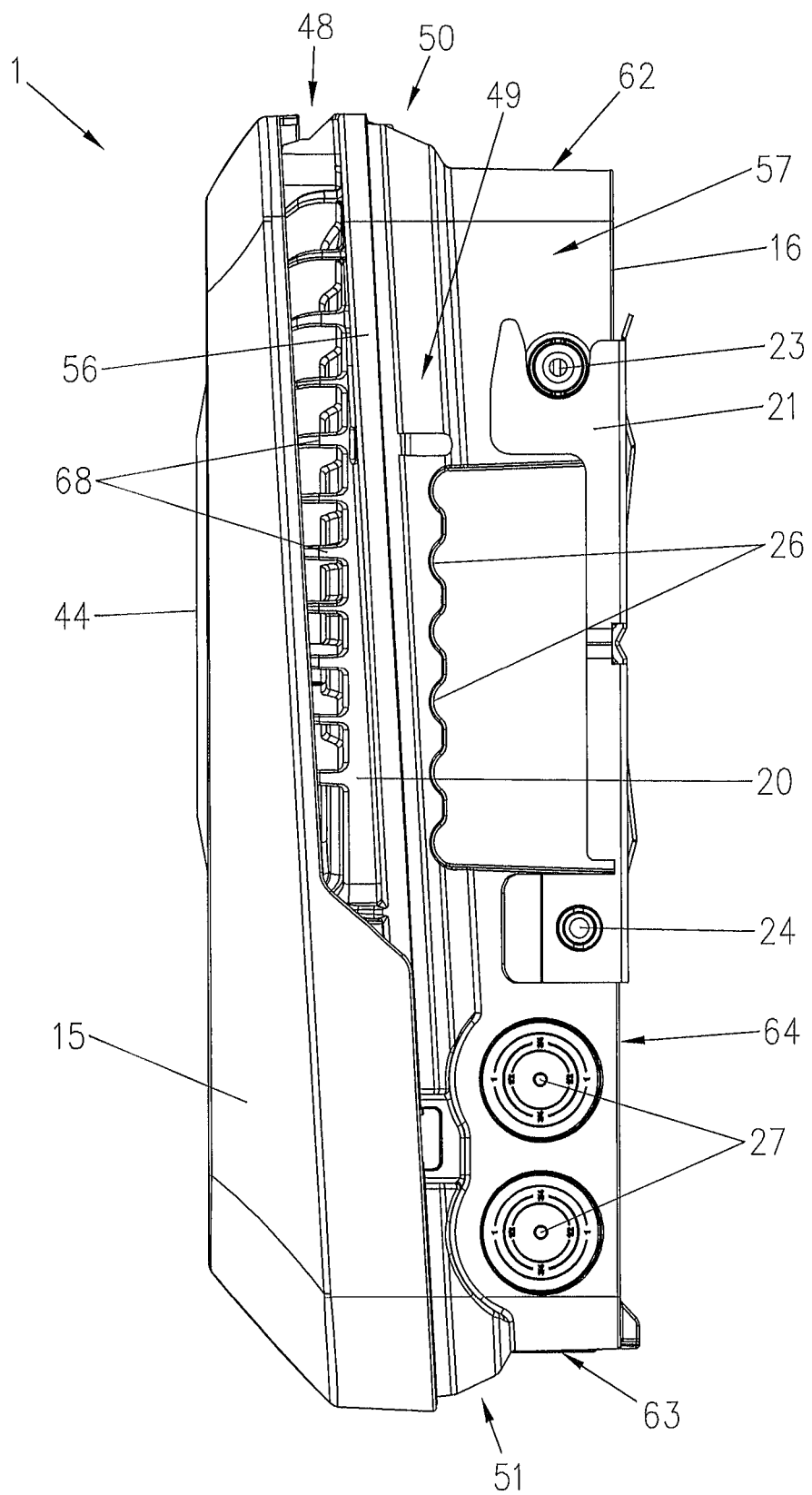
FIG. 4 shows a side view of the housing of the inverter.

The side view of the inverter 1 in FIG. 4 shows a slit-like opening 48 for forming an air outlet on the narrow side 49 of the housing between the front cover 15 and the basic shell 16. As can be seen, this opening 48 also extends across the upper narrow side 50 and further to the narrow side opposite the narrow side 49 of the housing. Advantageously, the lower narrow side 51 also comprises a slit-like opening 52 which is shown in cross-section in FIG. 5. Accordingly, the warm exhaust air of the inverter 1 is distributed on all sides about the housing 14. When several inverters 1 are arranged next to one another, there is no danger of the entire warm exhaust air of an inverter 1 being sucked in as "cooling air" by inverters 1 arranged adjacent thereto, which would clearly decrease the efficiency of the cooling. In addition, the arrangement of the air inlet 44 in the front cover 15 turns out to be advantageous, since thus warm exhaust air of a neighbouring device is not sucked in or hardly sucked in.

Figure 5:
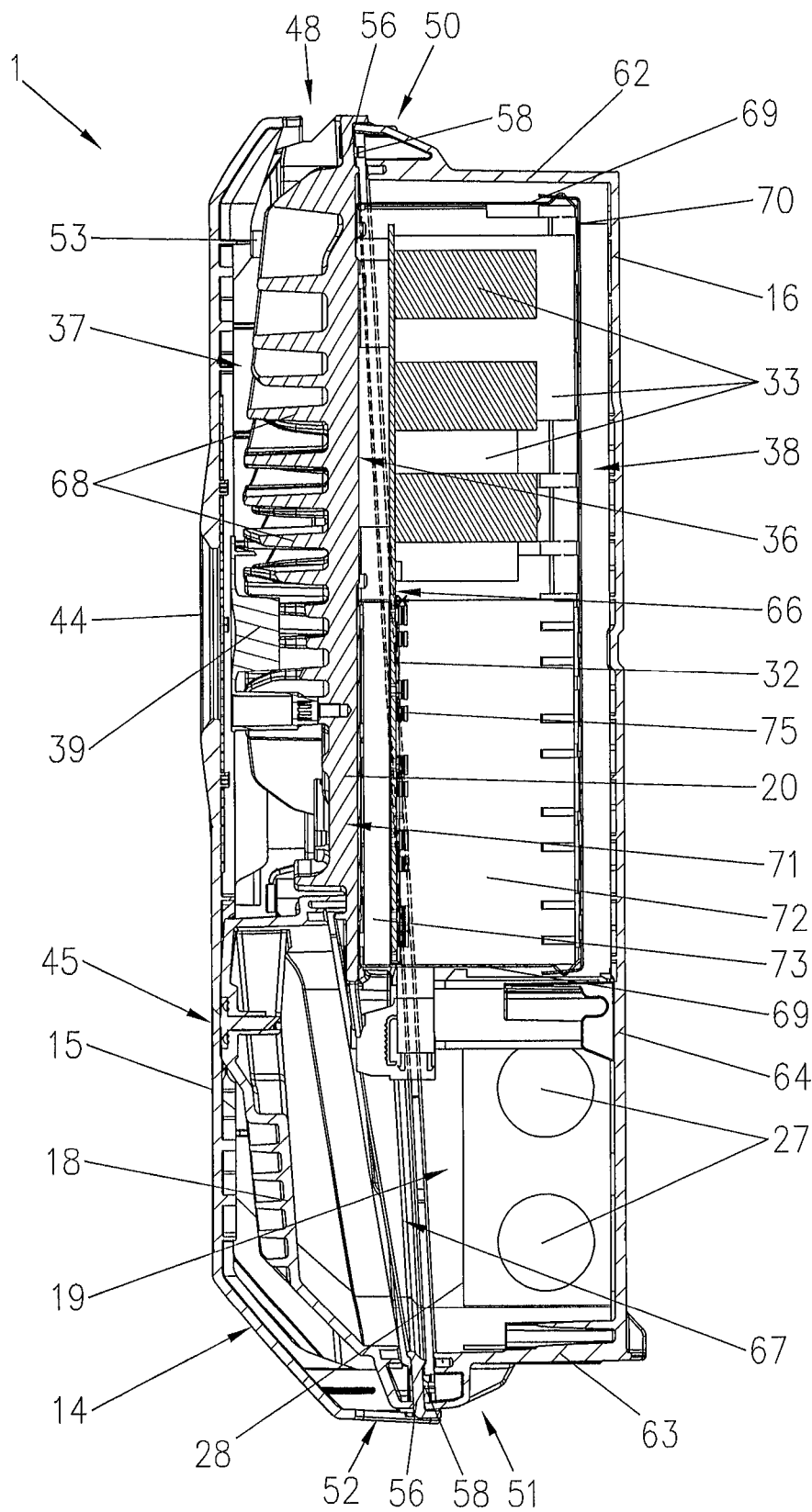
FIG. 5 shows a longitudinal section through the housing of the inverter along the section line V-V according to FIG. 2.

The longitudinal section in FIG. 5 shows that the heat sink 20 is partially adjacent to the front cover 15. The front cover 15 is supported by four pins 53 which are shown in FIG. 2 and FIG. 5, respectively. With its upper edge the front cover 15 engages behind projections 54 of the heat sink 20, is adjacent to the pin 53 and fixed to the heat sink 20 by means of screws 55 on its lower edge. The resulting tension in the front cover 15 prevents vibrations of the front cover 15, which might be caused by the operation of the inverter 1 or due to the sucked-in cooling air flow.

Furthermore, the heat sink 20 is adjacent with its surrounding frame 56 to all sidewalls 57, 62, 63 of the basic shell 16 and forms a stiffening for the housing 14. The stability of the assembled inverter housing 14 is improved by the heat sink 20, which allows a simpler and less expensive construction of the basic shell 16.

In addition the heat sink 20 divides the housing 14 into at least two housing chambers 37, 38. In this connection, the first, outer housing chamber 37 is formed between the front cover 15 and the heat sink 20 and the second, inner housing chamber 38 is formed between the heat sink 20 and the basic shell 16. Therefore, the cooling air from outside the housing 14 is received only from the first, outer housing chamber 37, in order to cool the heat sink 20. In addition, the heat sink 20 is shaded by the first, outer housing chamber 37, whereby heating of the heat sink 20 by direct solar radiation is prevented. This is of advantage especially when the inverter 1 is installed outdoors. The second, inner housing chamber 38, however, does not come into contact with the cooling air from outside the housing 14 and therefore is protected against impurities such as dust. By arranging the electrical components 33 in this second, inner housing chamber 38, the life as well as the maintenance intervals of the inverter 1 are increased, since defects due to impurities are prevented.

The second, inner housing chamber 38 is sealed with the sealing 58 between the heat sink 20 and the basic shell 16 and the protection of the second, inner housing chamber 38 against impurities and dust is improved accordingly.

The actuating shaft 59 of the DC disconnector 7 is passed through openings 60 on the printed circuit board 32 and the heat sink 20 to the front side of the housing 14. The actuating shaft 59 extends through the outer housing chamber 37. This allows the arrangement of the actuating element 17 of the DC disconnector 7 on the front cover 15, on the one hand, and of the DC disconnector 7 in the second, inner housing chamber 38 directly on the printed circuit board 32, on the other hand. For this, the centre of the DC disconnector 7 is arranged in alignment with the opening 60 on the printed circuit board 32 and the heat sink 20, so that the actuating shaft 59 can engage in the DC disconnector 7. The actuating element 17 is positively fixed in a recess on the heat sink 20, whereby the actuating shaft 59 projects through the opening 60 and engages in the DC disconnector 7. At the same time, the opening 60 is sealed by such fixing of the actuating element 17, whereby the protection of the second, inner housing chamber 38 against impurities and dust will remain despite the actuating shaft 17 passed through. The DC disconnector 7 can easily be actuated from outside, whereby nevertheless a simple and compact structure of the inverter 1 according to the invention is obtained.

According to FIG. 5 the longitudinal section along the section line V-V according to FIG. 2 of the basic shell 16 is essentially trapezoidal, whereby the two sidewalls 62, 63 are parallel to one another. Accordingly, the sidewall 62 is higher than the other sidewall 63. Since the main extension plane 36 of the heat sink 20 is in parallel to the base 64 of the basic shell 16, the surrounding frame 56 of the heat sink 20 is inclined relative to the main extension plane 36, in order to finish off with the lateral sidewalls 62, 63 of the basic shell 16. This angle 65 between the surrounding frame 56 of the heat sink 20 and the main extension plane 36 is clearly shown in FIG. 6.

Thus, in the case of the higher sidewall 62, a portion of increased depth between the heat sink 20 and the basic shell 16 will result, which permits arrangement of higher components 33, causes an improved convection of the cooling air and thus in general results in an inverter 1 of compact structure. In addition a basic shell 16 with a trapezoidal longitudinal section V-V is characterized by a plane sealing contour without any height difference. Thus, an inexpensive plug-in sealing—contrary to a costly foam sealing process—can be used. On the whole, the construction is simplified and may therefore be produced in a less expensive way.

The printed circuit board 32 is arranged with its component side 66 in the direction of the base 64 of the basic shell 16 and subsequently on the higher sidewall 62 of the basic shell 16. The result will be a sufficiently large space volume, also for placing higher components 33. In addition, due to the higher volume, especially higher components 33 often also have a higher heat emission and arrangement in the edge portion causes a better heat emission. On the whole, this has positive effects on the cooling of the inverter 1, especially when the inverter 1 is mounted on the wall and this higher sidewall 62 arranged on top. The warmer components 33 are thus arranged above the cooler ones, whereby the heat emission to the surroundings is improved. Furthermore, the DC inputs 5 and AC outputs 11 are arranged at a distance from the base 64 of the basic shell 16 by means of arranging the printed circuit board 32 with its component side 66 in the direction of the base 64 of the basic shell 16, which facilitates access to the DC inputs 5 and AC outputs 11. This in turn entails advantages for the operation and/or maintainability of the inverter 1, at the same time with a compact structure.

The connection region 19 is formed to be adjacent to the low sidewall 63 of the basic shell 16, whereby DC input 5 or AC output 11 are accessible in an improved manner. The sidewall 63 in this area permits an easy access to the connection terminals 29, 30 during operation and maintenance works due to its lower height. As may be seen from FIG. 2, the heat sink 20 comprises an opening 67 in the connection region 19, which allows an advantageous access to the connection terminals 29, 30 from the DC input 5 and the AC output 11 for operation and service. Shielding the second, inner housing chamber 38 off against the outside air during the operation of the inverter 1 is guaranteed by a cover 18 for the connection region 19.

Since the printed circuit board 32 is arranged with its side opposite the component side 66 on the heat sink 20, the printed circuit board 32 and thus also its electrical components 33 is cooled in an advantageous manner. In addition, the time and effort spent for service and repair on site is simplified, since the printed circuit board 32 and the heat sink 20 are jointly available as an exchange element. In addition, air conducting elements 68 within the housing 14 improve the cooling of the inverter 1. The cooling air flow is specifically guided through the housing 14 by means of the air conducting elements 68, in order to especially effectively adapt the cooling of the heat-emitting components 33. These air conducting elements 68 are mainly arranged on the heat sink 20, but also on other inverter parts, such as the cover 18 of the connection region 19.

Figure 6:
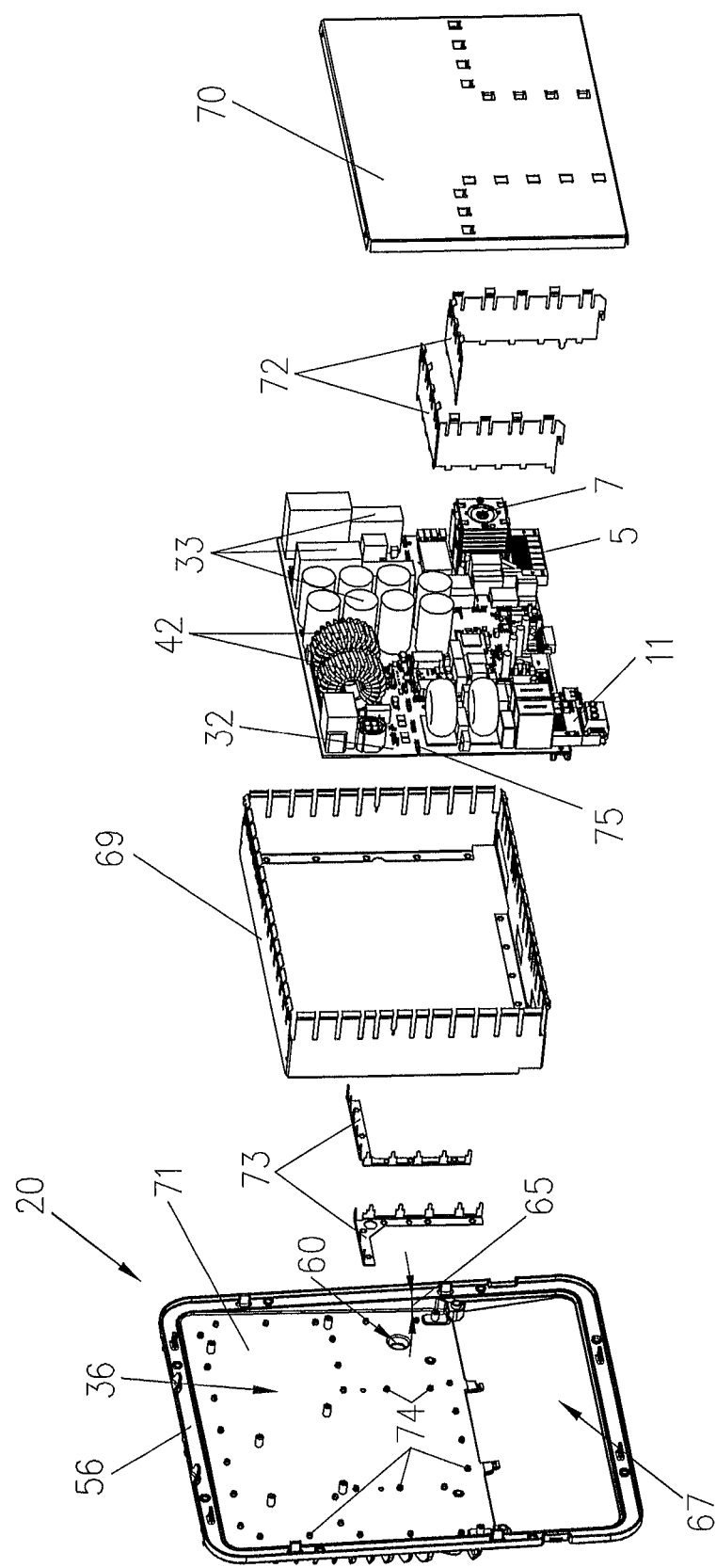
FIG. 6 shows an exploded view of the printed circuit board and enclosing shielding plates of the inverter.

As can be seen in FIG. 5 or the exploded view in FIG. 6, the shielding plates 69, 70, 71 enclose individual subassemblies 31 including the pertinent part of the printed circuit board 32 in a cage like manner and form a Faraday cage. The lateral shielding plates 69 are connected by means of a further shielding plate 70 above the components 33 and arranged in parallel to the printed circuit boards 32. An especially effective shielding of the electromagnetic waves is obtained, which allows observance of predetermined EMV threshold values.

In the shown exemplary embodiment, the heat sink 20 forms the shielding plate 71 on the side of the printed circuit board 32 facing away from the component side 66. This simplifies the structure of the electromagnetic shielding, since the electrically conductive heat sink 20 adopts the task of shielding, in addition to cooling. The heat sink 20, for example, may be an aluminium die cast heat sink 20, which in addition to the very good thermal conductivity also has an excellent electrical conductivity. An additional shielding plate 71 in parallel to the printed circuit board 32 is saved, which favours the compact structure of the inverter 1.

For the electromagnetic shielding, the subassemblies 31 for the DC-DC converter 8, intermediate circuit 9 and DC-AC converter 10 are additionally shielded with shielding plates 72, 73 as against the EMV filters 40, 41, with the pertinent DC input 5 or AC output 11. For this purpose, lateral shielding plates 72 are arranged between the printed circuit board 32 and the shielding plate 70 covering on the component side. The gap between the heat sink 20 and the printed circuit board 32 is closed with other shielding plates 73. On the heat sink side, these are pressed on mandrels 74 formed by the heat sink 20 and connected on the side of the printed circuit board through openings in the printed circuit board 32 to the lateral shielding plates 72 of the EMV filters 40, 41 subassemblies 31. This connection may be effected by means of a plug-in connection with springs 75 being soldered on the printed circuit board 32, but also a direct connection to the lateral shielding plates 72 of subassemblies 31 is conceivable. In the case of especially designed springs 75 on one side of the printed circuit board 32 and openings in the printed circuit board 32 a fastening of an EMV filter 40, 41 on both sides of the printed circuit board 32 is possible with one and the same spring 75. Shielding the EMV filters 40, 41 from other subassemblies 31 prevents the radiations from increasing or intensifying. Thus, even in the case of EMV filters 40, 41 of smaller dimensions, threshold values will be observed. As is shown in FIG. 3, a communication unit 13 is arranged close to the DC input 5 directly on the printed circuit board 32. Information of the upstream components of the energy system, energy suppliers, such as batteries and solar Modules 2 may be retrieved and the mode of operation of the inverter 1 be adapted due to the latest data and measuring values. Of course, a communication unit, which is not shown in more detail, is also conceivable in the area of the AC output 11, in order to pass on data of the inverter 1 or communicate with possibly available smart meters.

In the shown example of a photovoltaic inverter 1 according to FIG. 1 the communication unit 13 is adapted for communicating with the module electronics 3 on the solar modules 2. Therefore, information on the module level can be accessed by the inverter 1 and is used by the control unit 12 to control the inverter 1. In addition, a security element arranged on the module side, a so-called rapid shutdown box 4 can be controlled by the inverter 1, in order to be able to shut off the energy supply directly in the solar modules in the case of an error.

It is conceivable that both the DC-AC converter 10 and the DC-DC converter 8 are adapted for a bidirectional energy flow. Therefore, energy can be dissipated via the AC output 11 to the load(s). However, energy may also be received via the AC output 11, in order to charge provided energy storages, such as batteries. Depending on the respective energy storage, its connection to the DC inputs 5 may also take place on the intermediate circuit 9.

The invention claimed is:

1. An inverter for converting a DC voltage into an AC voltage comprising:
    at least one DC input,
    an AC output,
    a heat sink,
    a printed circuit board,
    a DC disconnector,
    a DC-DC converter,
    an intermediate circuit,
    a DC-AC converter and
    a housing with a front cover and a basic shell,
    wherein the electrical components of the DC-DC converter, intermediate circuit and DC-AC converter are combined into subassemblies, and at least the DC disconnector and the subassemblies of the DC-DC converter, intermediate circuit and DC-AC converter are directly arranged on the printed circuit board in a U-shaped manner corresponding to the energy flow direction from the DC input to the AC output, and
    wherein the printed circuit board is arranged with the component side facing in the direction of a base of the basic shell of the housing and with the side opposite the component side on the heat sink.

2. The inverter according to claim 1, wherein the printed circuit board is inclined relative to the base of the basic shell.

3. The inverter according to claim 1, wherein a control unit is provided, which control unit is centrally arranged on the printed circuit board.

4. The inverter according to claim 1, wherein at least one EMV filter is provided, said at least one EMV filter being arranged directly on the printed circuit board.

5. The inverter according to claim 1, wherein the DC-DC converter and the DC-AC converter are designed for switching frequencies above 30 kHz.

6. The inverter according to claim 1, wherein in the front cover a recess for an actuating element of the DC disconnector and an air inlet are arranged, and wherein an actuating shaft of the DC disconnector is passed through openings on the printed circuit board and the heat sink to the front cover.

7. The inverter according to claim 1, wherein on a narrow housing side between front cover and basic shell, openings for an air outlet are provided.

8. The inverter according to claim 1, wherein the heat sink connects at least partially to sidewalls of the basic shell of the housing and the heat sink forms a stiffener for the housing.

9. The inverter according to claim 1, wherein the heat sink subdivides the housing into at least two housing chambers.

10. The inverter according to claim 1, wherein a longitudinal section of the basic shell is designed essentially trapezoidal, wherein the basic shell has first and second sidewalls parallel to one another and wherein the first sidewall is lower than the second sidewall.

11. The inverter according to claim 10, wherein a connection region for connecting DC sources to the DC input and for connecting a load or the like to the AC output is arranged adjacent to the lower sidewall of the basic shell.

12. The inverter according to claim 1, wherein shielding plates are provided for cage-shaped enclosing of the printed circuit board including the subassemblies.

13. The inverter according to claim 12, wherein individual subassemblies are shielded off against other subassemblies with shielding plates (72, 73).

14. The inverter according to claim 1, wherein a communication unit is provided, which communication unit is arranged directly on the printed circuit board.

15. The inverter according to claim 1, wherein the DC-AC converter and/or the DC-DC converter is adapted for a bidirectional energy flow.

16. The inverter according to claim 1, wherein the inverter is a photovoltaic inverter for high power densities.

17. The inverter according to claim 1, wherein the inverter is a photovoltaic inverter for power densities of 250 $W/dm^3$ to 500 $W/dm^3$.

18. The inverter according to claim 1, wherein the DC-DC converter and the DC-AC converter are designed for switching frequencies greater than or equal to 100 kHz.

19. The inverter according to claim 9, wherein a sealing is arranged between the heat sink and the basic shell.

20. The inverter according to claim 12, wherein the heat sink partially forms part of the shielding plates.

* * * * *